US008133359B2

(12) United States Patent
Nauman et al.

(10) Patent No.: US 8,133,359 B2
(45) Date of Patent: Mar. 13, 2012

(54) METHODS AND APPARATUS FOR SPUTTERING DEPOSITION USING DIRECT CURRENT

(75) Inventors: Ken Nauman, Fort Collins, CO (US); Hendrik V. Walde, Fort Collins, CO (US); David J. Christie, Fort Collins, CO (US); Bruce Fries, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1091 days.

(21) Appl. No.: 11/941,548

(22) Filed: Nov. 16, 2007

(65) Prior Publication Data

US 2009/0127101 A1    May 21, 2009

(51) Int. Cl.
*C23C 14/34* (2006.01)
(52) U.S. Cl. ......... 204/192.13; 204/192.12; 204/298.03; 204/298.08
(58) Field of Classification Search ............. 204/192.12, 204/298.08, 298.03, 192.13
See application file for complete search history.

(56) References Cited

U.S. PATENT DOCUMENTS

| 4,595,482 | A | * | 6/1986 | Mintz ................. 204/298.03 |
| 5,015,493 | A | | 5/1991 | Gruen |
| 5,303,139 | A | | 4/1994 | Mark |
| 5,383,980 | A | | 1/1995 | Melber et al. |
| 5,651,865 | A | | 7/1997 | Sellers |
| 5,681,393 | A | | 10/1997 | Takagi |
| 5,777,863 | A | | 7/1998 | Kowalevskii et al. |
| 5,855,745 | A | | 1/1999 | Manley |
| 5,917,286 | A | | 6/1999 | Scholl et al. |
| 6,005,218 | A | | 12/1999 | Walde et al. |
| 6,024,844 | A | * | 2/2000 | Drummond et al. ..... 204/192.12 |
| 6,051,114 | A | | 4/2000 | Yao et al. |
| 6,063,245 | A | | 5/2000 | Frach et al. |
| 6,093,293 | A | * | 7/2000 | Haag et al. ............... 204/298.12 |
| 6,222,321 | B1 | | 4/2001 | Scholl et al. |

(Continued)

FOREIGN PATENT DOCUMENTS

DE       03538494 A1    7/1987

(Continued)

OTHER PUBLICATIONS

Notification of International Search Report and Written Opinion for PCT/US08/83640 mailed Jun. 26, 2009.

(Continued)

*Primary Examiner* — Rodney McDonald
(74) *Attorney, Agent, or Firm* — Neugeboren O'Dowd PC; Sean R. O'Dowd

(57) ABSTRACT

An apparatus and methods for plasma-based sputtering deposition using a direct current power supply is disclosed. In one embodiment, a plasma is generated by connecting a plurality of electrodes to a supply of current, and a polarity of voltage applied to each of a plurality of electrodes in the processing chamber is periodically reversed so that at least one of the electrodes sputters material on to the substrate. And an amount of power that is applied to at least one of the plurality of electrodes is modulated so as to deposit the material on the stationary substrate with a desired characteristic. In some embodiments, the substrate is statically disposed in the chamber during processing. And many embodiments utilize feedback indicative of the state of the deposition to modulate the amount of power applied to one or more electrodes.

12 Claims, 6 Drawing Sheets

U.S. PATENT DOCUMENTS

| | | | |
|---|---|---|---|
| 6,338,777 B1 | 1/2002 | Longstreth White | |
| 6,340,416 B1 | 1/2002 | Goedicke et al. | |
| 6,344,419 B1 | 2/2002 | Forster et al. | |
| 6,350,353 B2 | 2/2002 | Gopalraja et al. | |
| 6,359,424 B2 | 3/2002 | Iida et al. | |
| 6,413,382 B1 | 7/2002 | Wang et al. | |
| 6,522,076 B2 | 2/2003 | Goedicke et al. | |
| 6,527,918 B2 | 3/2003 | Goeckner et al. | |
| 6,532,161 B2 | 3/2003 | Kovalevskii et al. | |
| 6,567,278 B2 | 5/2003 | Rufer et al. | |
| 6,582,566 B2 | 6/2003 | List et al. | |
| 6,633,017 B1 | 10/2003 | Drummond et al. | |
| 6,735,099 B2 | 5/2004 | Mark | |
| 6,808,607 B2 | 10/2004 | Christie | |
| 6,853,142 B2 | 2/2005 | Chistyakov | |
| 6,872,289 B2 | 3/2005 | Mizuno et al. | |
| 7,247,221 B2 | 7/2007 | Stowell, Jr. | |
| 7,678,239 B2 * | 3/2010 | Haag et al. | 204/192.12 |
| 2003/0209423 A1 * | 11/2003 | Christie | 204/192.12 |
| 2005/0006226 A1 | 1/2005 | Baldwin et al. | |
| 2005/0167263 A1 | 8/2005 | Chistyakov | |
| 2006/0016560 A1 | 1/2006 | Yokogawa et al. | |
| 2006/0027451 A1 | 2/2006 | Park et al. | |
| 2006/0278518 A1 | 12/2006 | Kouznetsov | |
| 2006/0279223 A1 | 12/2006 | Chistyakov | |

FOREIGN PATENT DOCUMENTS

| | | |
|---|---|---|
| JP | 2006-117995 | 5/2006 |
| JP | 2007-277638 | 10/2007 |
| WO | WO2004106582 A2 | 9/2004 |

OTHER PUBLICATIONS

Williams, James, "International Search Report and Written Opinion re Application No. PCT/US11/036100", Aug. 2, 2011, Published in: AU.

Carniglia, C.K., Method for Calculating the Sputter Distribution from a C-MAG Cylindrical Target in the Presence of Gas Scattering, 39th Annual Technical Conference Proceedings, 1996, pp. 211-216, Publisher: Society of Vacuum Coaters, Published in: US.

Glaser, H.J., et al., History of Glass Coating for Architectural Glazing, 50th Annual Technical Conference Proceedings, 2007, pp. 216-229, Publisher: Society of Vacuum Coaters, Published in: US.

Heister, U., et al., New Developments in the Field of MF-Sputtering with Dual Magnetron to Obtain Higher Productivity for Large Area Coatings, 41st Annual Technical Conference Proceedings, 1998, pp. 187-192, Publisher: Society of Vacuum Coaters, Published in: US.

Madocks, J., et al., The Economic Advantages of Gap Reduction for an Architectural Glass Coater, 43rd Annual Technical Conference Proceedings Denver, Apr. 15-20, 2000, pp. 133-136, Publisher: Society of Vacuum Coaters, Published in: US.

Schilling, H., A New Plant Generation for Large Area Vacuum Coating of Architectural and Automotive Glass, 42nd Annual Technical Conference Proceedings, 1999, pp. 186-190, Publisher: Society of Vacuum Coaters, Published in: US.

* cited by examiner

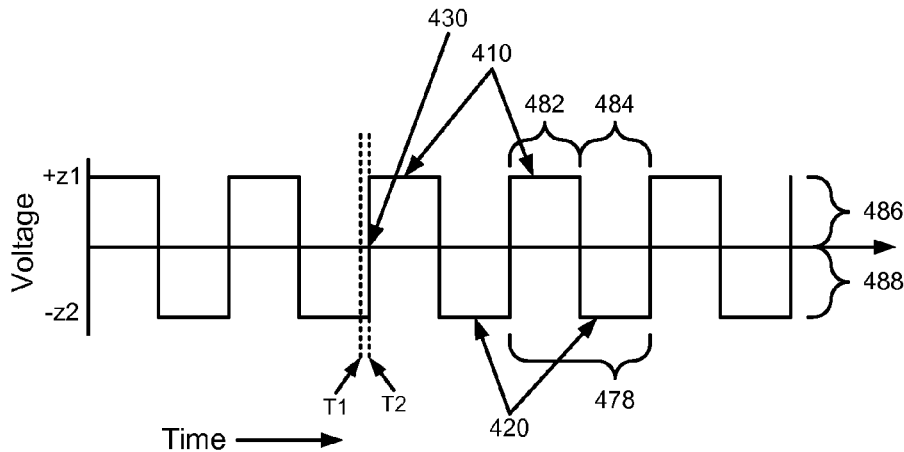
FIG. 4
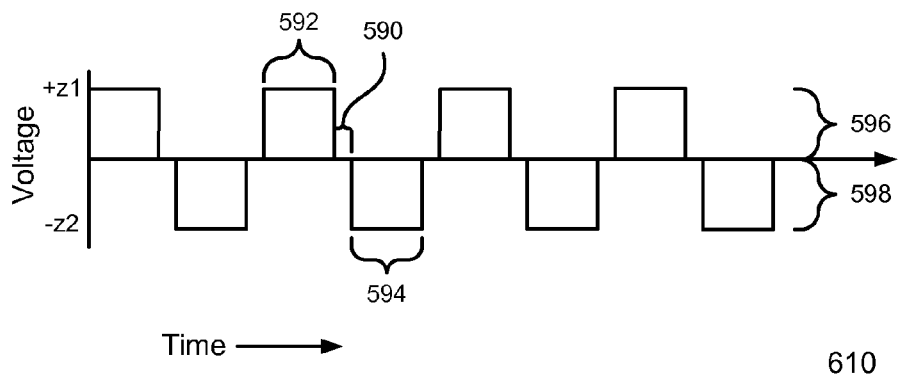
FIG. 5
| Pulse Parameter 620 | Pulse Parameter Values 630 |
|---|---|
| Pulse Power | 100 kW |
| Off-time | 5 microseconds |
| Pulse Duration (width) | 100 milliseconds |
| Voltage | 500 Volts |
| Cycle Time | 200.010 milliseconds |
| Polarity | Positive |
FIG. 6

METHODS AND APPARATUS FOR SPUTTERING DEPOSITION USING DIRECT CURRENT

FIELD OF THE INVENTION

The present invention relates to plasma-based sputtering deposition. In particular, but not by way of limitation, the present invention relates to methods and apparatus for plasma-based sputtering deposition using a direct current power supply.

BACKGROUND OF THE INVENTION

Plasma processing techniques have found wide-spread use in industry for commercial processes such as plasma vapor deposition, sputtering, and so forth. These processes have become particularly useful in thin film applications. To generate plasma, a power supply creates an electric potential between a cathode and one or more anodes that are placed in a plasma chamber containing the process gases that form the plasma. When using these processes for deposition, the plasma acts upon the material of a target (also referred to as a sputtering source) placed in the plasma chamber that normally comprises the cathode surface. Plasma ions are accelerated towards the target and cause target material to be dislodged from the cathode surface on impact. The dislodged target material is then deposited on a substrate to form a film (e.g., thin film). The film may constitute material sputtered by the plasma from the target surface, as disclosed above, or may be the result of a reaction between the target material and some other element included in the plasma or process gases.

High frequency voltage sources (e.g., alternating-current (AC) power sources) have been used to generate a high electrical potential that produces a plasma within a plasma chamber. These high-frequency voltage sources are expensive to construct and maintain, as well as complicated to operate. Additionally, if the deposition material is formed by reaction with an element in the plasma or process gases, and further, is electronically insulating, the anode in the chamber can be coated with the insulator; this deposit can then prevent the anode from performing its function of collecting electrons from the plasma during the deposition process.

To overcome the disadvantages associated with high frequency voltage sources, alternating pulsed direct current power sources have been employed in anodeless dual magnetron-type systems such as that disclosed in U.S. Pat. No. 5,917,286, which is incorporated herein by reference in its entirety. The process of reversing polarities allows the electrodes to alternately act as an anode and as a cathode, and the sputtering process that occurs during the cathode phase cleans off any deposited insulating material and permits uninhibited operation of the electrode as an anode during the anode phase. Additionally, the process of reversing polarities allows both electrodes to alternatively act as a cathode so that both electrode surfaces are capable of providing target material.

Although the present pulsed direct current power sources are functional, they are not sufficiently accurate or otherwise satisfactory in many thin film processing applications to achieve, for example, uniformity and/or particle generation thresholds. Co-sputtering of an arbitrary stoichiometry is also not achievable with standard technology. Accordingly, methods and apparatus are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for methods and apparatus for plasma-based sputtering deposition. In one exemplary method, a substrate is placed in a stationary position in a plasma processing chamber, and plasma is generated by connecting a plurality of electrodes to a supply of current. While the substrate is in a stationary position in the plasma processing chamber, a polarity of a voltage applied to each of a plurality of electrodes in the processing chamber is periodically reversed, and an amount of power applied to at least one of the plurality of electrodes is modulated so as to deposit the material on the stationary substrate with a desired characteristic.

In another embodiment, the invention may be characterized as a system for depositing material on a substrate in a plasma processing chamber, the system including a direct current power source configured to deliver a first direct current power pulse having a first polarity and a second direct current power pulse having a second polarity to an electrode within a plasma sputtering chamber. In addition, the system in this embodiment includes a feedback line from the chamber and a processor configured to trigger the second direct current power pulse after the first direct current power pulse has been triggered. And the processor is configured to modulate, responsive to a feedback signal on the feedback line, an amount of power applied to the electrode with the first direct power pulse.

In yet another embodiment, direct current power is delivered in pulses to each of a plurality of electrodes within a plasma sputtering chamber from at least one direct current power source, and feedback indicative of at least one monitored characteristic of the material on the substrate is received. In this embodiment an amount of power delivered to at least one of the electrodes is controlled responsive to the feedback so as to alter the deposition of the material.

In another embodiment, a direct current power source is configured to deliver power to a plasma sputtering chamber, and a power control component is configured to direct the power to a first electrode within the plasma sputtering chamber for a first time period and to direct the power to a second electrode within the plasma sputtering chamber for a second time period. In this embodiment, the power applied to the first electrode relative to the second electrode is defined by a desired characteristic of the deposited material on the stationary substrate.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

FIG. 4 is a graph that illustrates an example of DC power pulses produced by a DC power supply for an electrode of a plasma sputtering chamber, according to an embodiment of the invention;

FIG. 5 is a graph that illustrates a duty cycle that includes a transition time period that is greater than zero, according to an embodiment of the invention;

FIG. 6 is a table that illustrates an example of pulse parameters and pulse parameter values, according to an embodiment of the invention;

DETAILED DESCRIPTION

Figure 1:
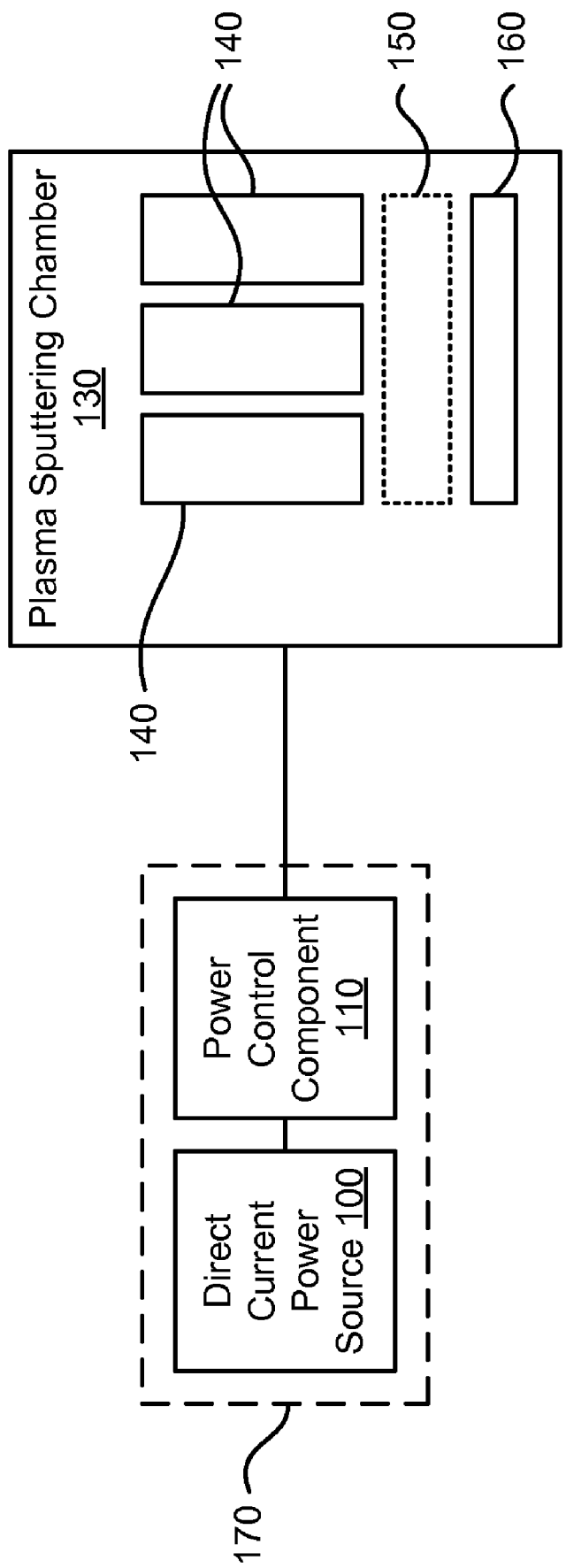
FIG. 1 is a schematic diagram of a direct current (DC) power source, a power control component, and a plasma sputtering chamber, according to an embodiment of the invention.

Referring now to the drawings, where like or similar elements are designated with identical reference numerals throughout the several views, and referring in particular to FIG. 1, it is a block diagram depicting a direct current (DC) power source 100, a power control component 110, and a plasma sputtering chamber 130, according to an embodiment of the invention. The plasma sputtering chamber 130 includes two or more electrodes 140 that are each configured to function as an anode and as a cathode (the cathode can be referred to as a sputtering target). The DC power source 100 and power control component 110 can be collectively referred to as a DC power supply 170. It should be recognized, however, that the block diagram of FIG. 1 is merely logical and in some embodiments the power source 100 and the power control component 110 are realized as separate components. In one embodiment for example, the power control component 110 is implemented as an additional component to an existing DC power source.

In general, the DC power source 100 is configured to supply DC power to the power control component 110. In several embodiments, the DC power source 100 provides power in the range of 20 to 200 Kilowatts, but other power levels are certainly contemplated. And in many embodiments, the DC power source 100 is realized by multiple DC generators that are coupled together. In one embodiment for example, the DC power source is realized by three 50 Kilowatt DC generators to provide a 150 kW power supply.

The plasma 150 is formed from one or more gases, including a noble gas (e.g., argon) or other gaseous species, and may be formed from a chemical compound having a specified composition. In some embodiments, magnetic fields (not shown) are applied within and/or outside of the plasma sputtering chamber 130 (e.g., at locations around the electrodes 140) to promote the ionization of the gas and possibly the direction of plasma ions of the plasma 150 to any of the electrodes 140 and/or the substrate 160.

When plasma 150 is ignited and sustained in response to a voltage potential between electrodes 140, plasma ions are accelerated towards and impact an electrode 140 functioning as a cathode to cause atoms from the electrode 140 to be ejected towards a substrate 160. In some embodiments, the electrodes 140 are referred to as a target and the atoms (e.g., material) ejected toward the substrate is referred to as target atoms (e.g., target material). In many implementations, the target material includes a metallic substance such as aluminum or a different material such as a ceramic. And is some implementations (e.g., co-sputtering) the target material for each individual electrode 140 may include different material or composition.

Although not required, in many embodiments the DC power source 100 is configured to detect one or more arcs (e.g., micro arc and/or hard arcs) forming within the plasma sputtering chamber 130. An exemplary power supply that is configured with arc-handling capabilities is the SUMMIT model DC generator available from Advanced Energy Incorporated in Fort Collins, Colo. In other embodiments, arc detection is carried out by the power control component 110. As one of ordinary skill in the art appreciates, an arc can have a detrimental effect on, for example, the plasma sputtering chamber 130 and/or an object (e.g., semiconductor substrate) within the plasma sputtering chamber 130.

The power control component 110 is generally configured to manage power produced by the DC power source 100 and to provide managed power to the sputtering chamber 130. Specifically, the power control component 110 is configured to manage the power from the DC power source 100 to the electrodes 140 such that a plasma 150 is ignited and/or sustained. In several embodiments for example, the power control component 110 is configured to send DC pulses of power with alternating polarities to the electrodes 140 such that each of the electrodes 140 operates as a cathode for a period of time and as an anode for a period of time.

An advantage of many embodiments, by virtue of the alternating polarity of DC pulses applied to the electrodes by the power control component 110, is flexibility with respect to the spacing of the electrodes because there are effectively no dedicated anodes. As a consequence, this "anodeless" DC sputtering enables electrodes to be located as desired (e.g., to enhance film uniformity and/or to generate plasma where it is desired to be generated within the chamber 130), which in many implementations, reduces sources of contamination and results in a less complicated mechanical system.

Beneficially, the power control component 110 in several embodiments is configured to modulate an amount of power to each of, at least, a portion of the electrodes 140. As a consequence, the power control component 110 in many embodiments enables the amount of target material that is sputtered from one or more of the electrodes to be varied to enable the target material to be deposited on the substrate 160 in a desired manner. For example, in several embodiments, the power to one or more of the electrodes 140 is independently controllable to enable material to be deposited with a desired topology, resistance, strength, etc. Moreover, in many implementations, the power delivered to one or more of the electrodes is modulated responsive to feedback from the plasma chamber 130 (e.g., feedback indicative of a thickness of the deposited layer, resistance of the layer, optical properties of the layer, etc.).

By way of further example, the power control component 110 in many implementations is configured to enable a uniform deposition of target material on the substrate 160 by modulating power to one or more of the electrodes 140 while target material is being deposited on the substrate. Moreover, in some embodiments, the amount of target material remaining on an electrode may be monitored and the power applied to that electrode may be modulated based on the amount of target material remaining so as to enable the amount of target material that is utilized to be maximized without removing unwanted material from the electrode. This is a major benefit because target material is often very expensive and increasing an amount of target material that is used (while avoiding the removal of unwanted material from the electrode) will save a substantial amount of money, and in addition, the time periods between required maintenance may also be increased—again saving time and money—due to less contamination from unwanted removal of electrode material.

In many embodiments, the substrate 160 is held in a static position while material is deposited on the substrate 160. As a consequence, in these static-deposition embodiments, the amount of undesirable particles that become entrained in the plasma 150 due to moving parts is substantially reduced; thus the number of defects that are due to impurities in the layer deposited on the substrate are reduced. Moreover, particle-induced arcing is also reduced, which improves the quality of the processing.

Another advantage of many embodiments disclosed herein is the ability to carry out metallic sputtering with DC power (e.g., DC power with an alternating polarity). For example, many embodiments described herein enable metallic sputtering on a static substrate utilizing techniques that modulate power to one or more of the electrodes.

In several embodiments, the power control component 110 is configured to trigger the alternating DC pulses of power at frequencies around 10 Hz to 20 kHz. In some embodiments, the power control component 110 operates to provide DC pulses around 10 Hz to 2 kHz, and in other implementations the power control component 110 operates to provide DC pulses around 10 Hz to 500 Hz. In one exemplary embodiment, the power control component delivers DC power pulses at a frequency of 60 Hz, and in yet other embodiments, the power control component 110 operates to provide DC pulses around 10 Hz to 50 Hz. In many variations, the pulse width of each of the alternating power pulses is at least longer than the arc detection time of the DC power source 100.

In some embodiments, the pulse width of each of the alternating power pulses is shorter than a thermal time constant associated with one or more of the electrodes 140 to substantially prevent changes in temperature of one or more of the electrodes 140 that could affect deposition (e.g., uniformity, film quality, deposition rates). And in some variations, the pulses have characteristics (e.g., width, frequency, etc.) based on a thermal threshold condition. The thermal threshold condition can be associated with a component associated with the plasma sputtering chamber 130 (e.g., wiring, connectors, etc.) or an electrode 140 associated with the plasma sputtering chamber 130. For example, in some embodiments, the thermal threshold condition is defined to prevent a particular component associated with the plasma sputtering chamber 130 or electrode 140 from exceeding or falling below a specified temperature.

The power control component 110 in many embodiments includes one or more switches (not shown) such as, for example, an insulated gate bipolar transistor (IGBT) and/or a control module (not shown). In some embodiments, the control module includes a control algorithm (e.g., open loop control algorithm or closed loop control algorithm) that is used in conjunction with one or more switches to produce DC power pulses according to pulse parameter values. In some embodiments, the pulse parameter values are accessed from a memory (not shown) associated with the power control component 110 and/or the DC power source 100.

In some embodiments, one or more of the functions of the power control component 110 are incorporated into the DC power source 100, and in other embodiments, one or more of the functions of the DC power source 100 are incorporated into the power control component 110. And in some variations, the modules disclosed herein are implemented by software, firmware and/or hardware that are dynamically modified and/or statically configured.

Figure 2:
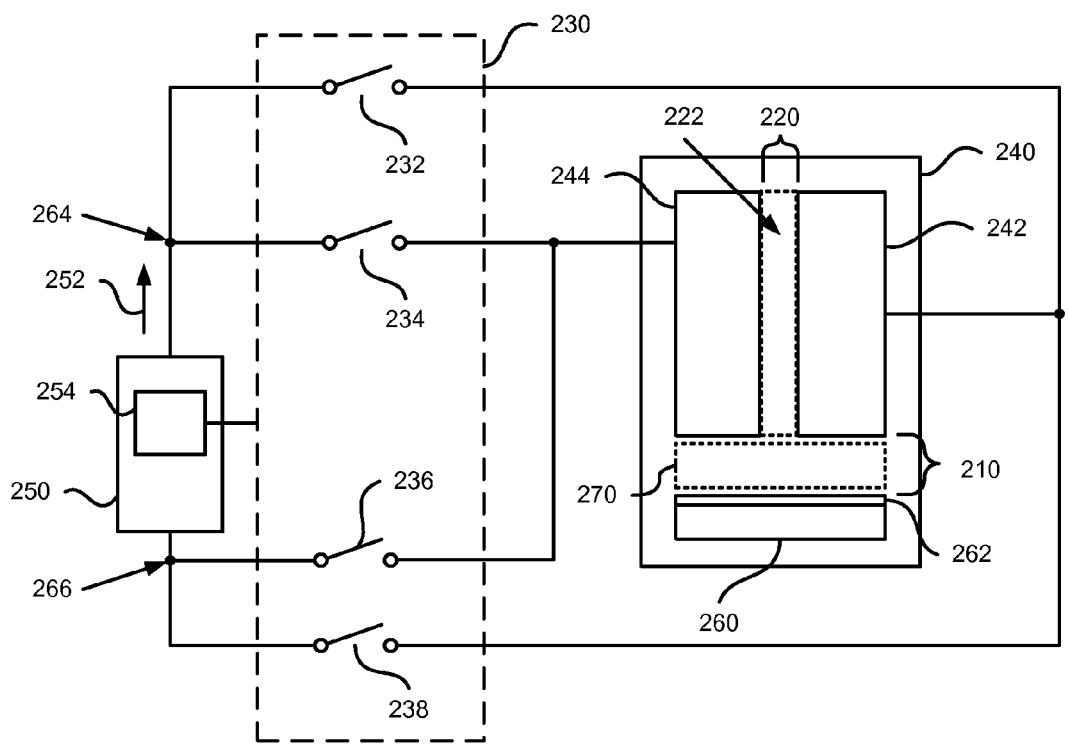
FIG. 2 is a schematic diagram that illustrates a DC power source and a power control component configured to produce DC power pulses at an ultra-low frequency for a plasma sputtering chamber, according to an embodiment of the invention.

Referring next to FIG. 2, it is a schematic diagram that illustrates a DC power source 250 (e.g., current source) and a power control component 230 configured to produce DC power pulses at an ultra-low frequency for a plasma sputtering chamber 240, according to an embodiment of the invention. Specifically, the path of the current 252 to the plasma sputtering chamber 240 is controlled by the power control component 230 to create DC power pulses. The power control component 230 includes switches 232 and 234 that are connected in a parallel configuration to a positive polarity node 264. The power control component 230 also includes switches 236 and 238 that are connected in a parallel configuration to a negative polarity node 266.

Switches 232, 234, 236, and 238 are alternately closed to apply power to electrodes 244 and 242 of the plasma sputtering chamber 240 in an alternating fashion such that a plasma is ignited and/or sustained in a plasma formation region 270. A substrate 260 is disposed within the plasma sputtering chamber 240 so that at least some material dislodged from the electrodes 242 and 244 by the plasma is deposited on the substrate 260 in a deposition layer 262 when the plasma is ignited and/or sustained in the plasma formation region 270. In some embodiments, at least two of the switches 232, 234, 236, and 238 are closed at substantially the same time (e.g., substantially simultaneously). The deposition layer 262, in some embodiments, is a thin-film transistor (TFT) deposition layer, but this is certainly not required and many other applications are contemplated.

By alternating current to the electrodes 242 and 244, one of the electrodes functions as a cathode for a period of time while the other functions as an anode during that period of time. For example, in a first state of operation, switches 232 and 236 are closed while switches 234 and 238 are open such that current flows from the DC power source 250 through electrode 242 and then through electrode 244. In this first state of operation, electrode 242 will be functioning as an anode while electrode 244 will be a functioning as a cathode. A plasma will be ignited and/or sustained in the plasma formation region 270 and the substrate 260 will be coated by material dislodged from electrode 242.

In a second state of operation, switches 234 and 238 are closed while switches 232 and 236 are open such that current flows from the DC power source 250 through electrode 244 and then through electrode 242. In this second state of operation, electrode 242 will be functioning as a cathode while electrode 244 will be a functioning as an anode. A plasma will be ignited and/or sustained in the plasma formation region 270 and the substrate 260 will be coated by material dislodged from electrode 244. In many embodiments, a control module 254 (e.g., a processor executing stored instructions) associated with the DC power source 250 is configured to trigger the switching of the switches 232, 234, 236, and 238 according to pulse parameter values.

In some implementations, the electrodes 242 and 244 are separated by a space 220 that defines a volume 222 (shown in FIG. 2) that is defined such that a current discharge density in volume 222 is significantly smaller than that in the plasma formation region 270 during operation of the plasma sputtering chamber 240. The size and/or shape of the volume 222 is defined, in some embodiments, to have a specified current discharge density.

The current discharge density in a volume such as volume 222 corresponds with ignition of a plasma within that volume. For example, a low current discharge density in the volume 222 corresponds with a low probability for ignition of a plasma within volume 222. In other words, the volume 222 can be defined such that the probability for ignition of high density plasma in the volume 222 is substantially lower than that in the plasma formation region 270. In some variations, the volume 222 is defined to satisfy a plasma formation criteria (e.g., threshold, condition) associated with the plasma formation region 270 and/or the volume 222. As discussed, an advantage of anodeless operation is the flexibility to alter the space 220 between the electrodes to effectuate desired sputtering characteristics.

The flow of current between the electrodes 242 and 244, and consequently plasma ignition, is modified using, for example, magnets (not shown) within the plasma chamber 240. For example, in some embodiments, the flow of current between the electrodes 242 and 244 is modified using one or more magnets or an electrically derived magnetic filed to cause the current discharge, and thus the probability for plasma ignition, to be much higher in the plasma formation region 270 than in the volume 222.

In some embodiments, the size of the volume 222, process gas pressure, voltage applied to the electrodes, and/or direction of the magnetic filed are defined to produce a specified ratio of current discharge density between the plasma formation region 270 and the volume 222. In some implementations, the spacing 220 is significantly smaller than a cathode dark space.

In some variations, the size of the spacing 220 is defined based on a target deposition profile (also referred to as a deposition profile target) associated with the deposition of material from the electrodes 242 and 244 on substrate 260 in the deposition layer 262. In other words, the electrodes 242 and 244 are positioned to achieve the target deposition profile and consequently define, at least in part, the spacing 220, and hence, the volume 222. In some embodiments, the target deposition profile is defined according to one or more deposition profile criteria (e.g., threshold, condition) associated with different locations (e.g., different spatial locations, different areas) associated with the deposition layer 262.

In some variations, for example, the space 220 and/or volume 222 are defined so that material deposited on the substrate 260 from the electrodes 242 and 244 in the deposition layer 262 will satisfy a set of deposition profile criteria (e.g., deposition uniformity criteria) associated with a thin-film transistor process. In some implementations, the target deposition profile includes a target chemical composition and/or a target thickness (e.g., substantially uniform thickness across the substrate 260).

The space 220 and/or volume 222 in many embodiments are defined to account for anisotropic sputtering from the electrodes 242 and 244. For example, the spacing 220 and volume 222 can be defined to reduce the effects of anisotropic sputtering to achieve a target deposition profile of the deposition layer 262 on the substrate 260.

In several embodiments, the spacing 220 (e.g., volume 222) and a distance 210 between the electrodes 242 and/or 244 and the substrate 260 are defined to achieve a particular target deposition profile on substrate 260. Decreasing the distance 210 between the electrodes 242 and/or 244 and the substrate 260, in many embodiments, increases the quality of the deposition layer 262 and/or increases the deposition rate of material from the electrodes 242 and/or 244. For example, in some embodiments, the space 220 (and volume 222) is decreased as the distance 210 is decreased to increase the uniformity of deposition on the substrate 260. In some embodiments, the space 220 (and volume 222) is increased as the distance 210 is decreased to increase the thickness uniformity of the deposition layer 262 on the substrate 260. In addition, process gas pressure can also be adjusted to achieve desired uniformity and film properties.

Moreover, in some implementations the spacing 220 between the electrodes 242 and 244 is defined based on a pressure threshold condition. For example, in some embodiments, the electrodes 242 and 244 are positioned such that the probability of forming a plasma in volume 220 is minimized, based on the range of expected process gas species and pressures. Initiation of a plasma is dependent on the gas pressure and spacing of the electrodes and as such this may be optimized to reduce the probability of plasma formation.

In addition to the benefit of having more flexible electrode spacing as compared to prior art DC processing techniques, because the DC power pulses in many embodiments are delivered at an ultra-low frequency, the probability of heating of the substrate 260 is lower than that in an analogous AC powered system where, for example, stochastic heating of the substrate 260 can be a prevalent issue. Consequently, the distance 210 between the electrodes 242 and/or 244 and the substrate 260, in some embodiments, is smaller than that in an analogous AC powered system. By decreasing the distance 210, as compared with analogous AC power systems, the deposition profile of the deposition layer 262 can be more readily controlled and film properties can be improved. Because the alternating DC power pulses in these embodiments are delivered at an ultra-low frequency and the electrodes 242 and 244 are inherently both anodes and cathodes, the necessity for anode cooling and plasma sputtering chamber 240 cooling is substantially reduced or eliminated in some embodiments.

In addition to spacing the electrodes 242, 244 to affect a deposition profile, the spacing 220, in some embodiments, is defined such that a probability for arcing or shorting between the electrodes 242 and 244 is substantially close to zero or maintained at an acceptably low level (e.g., below a maximum level) according to, for example, an arcing level criteria (e.g., threshold, condition). If arcing or shorting between the electrodes 242 and 244 occurs, formation of a plasma in the plasma formation region 270 can be detrimentally affected, but in some applications, a low level of arcing between the electrodes 242 and 244 can be tolerated.

In some embodiments, the space 220 and/or volume 222 between the electrodes 242 and 244 is defined so that arcing (e.g., number of arcs, arc current) can be maintained at a specified level without substantially affecting a target deposition profile of a deposition layer 262 on the substrate 260. For example, in some embodiments, the volume 222 is defined so that arcing will be below a specified level and one or more target deposition criteria will be satisfied.

Although decreasing the spacing 220 (e.g., volume 222) between the electrodes 242 and 244, in many embodiments, promotes increased uniformity across the deposition layer 262 (e.g., uniform thickness across the deposition layer 262) and decreases the probability for formation of unwanted plasma between the electrodes 242 and 244, the probability for undesirable arcing between the electrodes 242 and 244 is increased. As a consequence, the spacing 220 between the electrodes 242 and 244 is defined to satisfy (e.g., balance) one or more deposition profile criteria, one or more arcing level criteria, and/or one or more plasma formation criteria.

Figure 3:
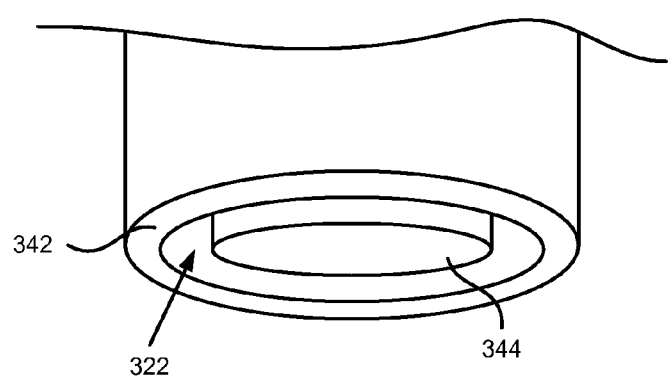
FIG. 3 is a schematic diagram that illustrates a set of concentric electrodes separated by a volume, according to an embodiment of the invention.

Although volume 222 is shown in FIG. 2 as a rectangular volume, this is certainly not required, and in variations, the volume 222 is another of many potential different shapes (e.g., a multi-sided polygon with a specified thickness). For example, FIG. 3 is a schematic diagram that illustrates a set of concentric electrodes 344 and 342 separated by a volume 322, according to an embodiment of the invention. In this embodiment, electrode 342 is an annular electrode. Like the electrodes 242 and 244 shown in FIG. 2, by alternating current to the electrodes 342 and 344, one of the electrodes functions as a cathode for a period of time while the other functions as an anode during that period of time.

FIG. 4 is a graph that illustrates an example of DC voltage applied by a DC power supply (e.g., DC supply 170) to an electrode of a plasma sputtering chamber, according to an embodiment of the invention. The DC voltage shown in FIG. 4 can be, for example, applied to either of the electrodes 242 or 244 shown in FIG. 2, or either of the electrodes 342 or 344 shown in FIG. 3. The graph illustrates voltage on the y-axis with a scale from +z to −z and the x-axis illustrates time increasing to the right.

As shown, the positive DC pulses 410 have a pulse width 482 (e.g., pulse duration) and the negative DC pulses 420 have a pulse width 484. The positive pulses 410 have a pulse height 486 of +z and the negative pulses 420 have a pulse height 488 of −z. In some embodiments, the positive pulses 410 and the negative pulses 420 have the same or different voltage levels. The duty cycle of the positive pulses 410 is defined as the duration of a positive pulse 482 divided by the duration of a cycle 478 (e.g., pulse width of a positive pulse plus the pulse width of a negative pulse). And the duty cycle of the negative DC pulses 420 is defined as the duration of a negative pulse 484 divided by the duration of a cycle 478.

In many embodiments, each of the pulse widths 482 of the positive pulses 410 and the pulse widths 484 of the negative pulses 420 are defined to have a duration longer than a response time of a control loop (e.g., proportional-integral-derivative (PID) control loop, open loop control loop) associated with the DC power supply (e.g., DC power supply 170) to allow for time to accurately produce the DC power pulses 410 and 420.

Although not required, in some embodiments, each of the pulse widths 482 of the positive DC pulses 410 and the pulse widths 484 of the negative DC power pulses 420 are defined to have a duration that is longer than the arc detection time of a DC power supply and/or a duration that is shorter than a thermal time constant associated with an electrode (e.g., edge electrode near the edge of a substrate) to substantially prevent changes in temperature of the electrode that could affect deposition (e.g., uniformity of the deposition, deposition rate).

As shown in FIG. 4, the polarity changes substantially instantaneously from the positive DC pulses 410 to the negative DC pulses 420. In some embodiments, a change or transition from a positive DC pulse 410 to a negative DC pulse 420, and vice versa, is referred to as a transition time period 430. The power changes substantially instantaneously from a positive DC pulse 410 to a negative DC pulse 420, and vice versa, when the transition time period 430 is substantially equal to zero (as shown in FIG. 4).

To achieve a substantially instantaneous change between, for example, a negative DC pulse 420 and a positive DC pulse 410, one or more switches within a DC power supply such as that shown in FIG. 1 are triggered in advance of the change to account for switching time delay. In some embodiments, for example, a switching component such as an FET or IGBT transistor within a DC power supply can have a switching time delay of 10 to a few hundred nanoseconds (ns) (e.g., require 10 to a few hundred ns to change from an on-state to an off-state). Accordingly, the FET or IGBT transistor can be triggered to switch in advance of a specified switching time from a negative DC pulse 420 to a positive DC pulse 410, and vice versa, to account for the switching time delay.

As shown in FIG. 4, a switch is triggered at time T1 based on a switching time delay so that the transition from the negative DC pulse 420 to the positive DC pulse 410 can instantaneously occur at time T2. In some embodiments, the voltage drop when switching between alternating polarities is less than the arc voltage detection capability of the DC power supply to substantially prevent false triggering of arc extinguishing mechanisms associated with the DC power supply.

In some embodiments of the invention, the transition time period is substantially greater than zero. For example, FIG. 5 is a graph that illustrates a duty cycle that includes a transition time period that is greater than zero, according to an embodiment of the invention. In this embodiment, the transition time period includes a time period 590 where no power is being delivered to a plasma sputtering chamber. The time period 590 may be referred to as an off-time period, and in some embodiments, the off-time period 590 is shorter than an arc detection time period so that the off-time period 590 is not erroneously registered by a DC power supply as an undesirable arc. Otherwise communication between the power control component 110 and/or the DC power source 100 could eliminate false detection of arcing.

Referring back to FIG. 4, the transition time period 430 in many embodiments may be defined so that re-ignition of a plasma within a plasma sputtering chamber is prevented and voltage transients are minimized. Specifically, the transition time period between alternating pulses produced by a DC power source (e.g., DC power source 100) and power control component (e.g., power control component 110) may be defined so that the transition time period is shorter than a plasma decay time period, and as a consequence, the plasma does not need to be re-ignited between alternating DC power pulses. This is in contrast to a plasma sputtering chamber powered by an AC power source where a plasma in a sputtering chamber is re-ignited or is substantially decayed or there are substantial voltage transients with every polarity reversal in the AC cycle (especially when the frequency is relatively low). Moreover, some AC power systems require relatively high ignition voltages, or voltage transients, with each AC half cycle because the plasma can be extinguished completely, and these high ignition voltages, or voltage transients, may be avoided in many embodiments that operate to reduce transition time periods as discussed above.

Even with a duty cycle that has a transition time period greater than zero such as that shown in FIG. 5, the transition time period may be defined such that the plasma is not substantially decayed and/or extinguished during the transition time period. In some embodiments for example, the transition time period is defined to be longer than the decay time associated with a plasma so the plasma is extinguished between alternating polarity pulses of power.

In some embodiments, the pulse widths 482 and 484, transition time period 430, pulse heights 486 and 488, and/or duty cycles, etc. are defined by pulse parameter values that are stored in a memory and/or accessed by a processor associated with the DC power supply or a component of a DC power supply (e.g., power control component 110 and/or DC power source 100). And these pulse parameter values may define the positive DC power pulses 410 and/or the negative DC power pulses 420.

The DC power supply 170, in some variations, is configured to reverse the polarity of a pulse to extinguish an arc in response to detecting the arc. In some embodiments, the DC power supply 170 is configured to deliver more than one positive DC pulse subsequent to another positive DC pulse or deliver more than one negative DC pulse subsequent to another negative DC pulse when delivering alternating power pulses.

FIG. 6 is a table 610 that illustrates an example of pulse parameters 620 and pulse parameter values 630, according to an embodiment of the invention. The table 610 includes, but is not limited to, pulse parameters 620 of pulse power, off-time, pulse duration (width), pulse voltage, cycle time, and polarity. The pulse parameter values 630 are exemplary values only, and in some embodiments, the pulse parameter values 630 vary widely from the pulse parameter values 630 shown in table 610.

Figure 7:
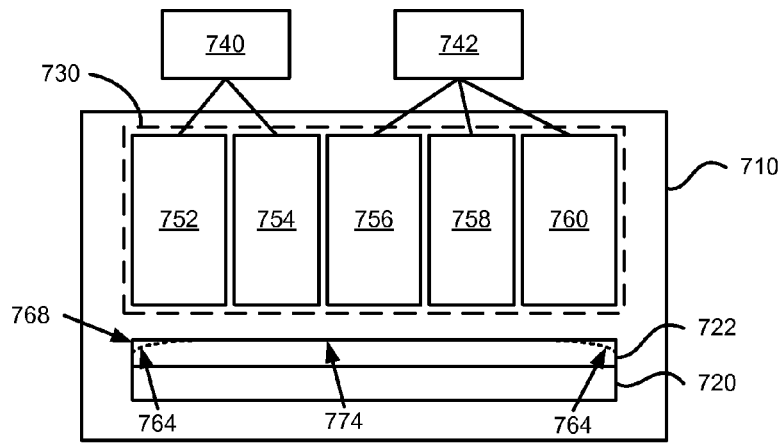
FIG. 7 is a schematic diagram that illustrates a plasma sputtering chamber coupled to DC power supplies, according to an embodiment of the invention.

Referring next to FIG. 7, shown is a schematic diagram that illustrates a plasma sputtering chamber 710 coupled to DC power supplies 740 and 742, according to an embodiment of the invention. The DC power supplies 740 and 742 are configured to deliver DC power pulses to the plasma sputtering chamber 710 to ignite and/or sustain a plasma used to cause deposition of a deposition layer 722 (e.g., a thin-film transistor layer) on a substrate 720. In particular, the DC power supply 740 is configured to deliver alternating DC pulses to electrodes 752 and 754 and DC power supply 742 is configured to deliver alternating DC power pulses to electrodes 756, 758, and 760. Although the DC power supplies 740, 742 are depicted as unitary devices, it should be recognized that the power supplies 740, 742 may be realized by a collection of distributed components. For example, each power supply 740, 742 may include more than one DC power source, and power control component(s) (e.g., switching power control components) may be housed separately from the DC power source(s).

Although certainly not required, in several embodiments, chamber 710 is configured to enable the substrate 720 to remain static during deposition of layer 722, and pulses are applied to the electrodes 730 to effectuate deposition of a deposition layer 722 in accordance with a target deposition profile 768 (e.g., a desired morphology (e.g., topology), thickness, resistance, optical property, film stress, density, crystallinity and/or adhesion, etc.) on the stationary substrate 720.

In many embodiments for example, power to one or more of the electrodes 730 is modulated to enable differential sputtering between the electrodes. In this way, the target deposition profile 768 may be achieved without moving the substrate 720 to accomplish a desired deposition profile. As a consequence, unlike prior art techniques that rely on motion of the substrate 720 to deposit the layer 722 with a desired profile 768, several embodiments of the present invention enable static-substrate deposition, which reduces the likelihood of undesirable particles being generated by the conveyer mechanism and undesirably transported to the surface of a moving substrate; thus reducing the likelihood of arcing and impurities in the layer 722.

For clarity, FIG. 7 does not depict optional feedback line(s) and sensor(s), but in many embodiments, one or more characteristics (e.g., morphology, thickness, resistance, optical property, film stress, density, and/or adhesion, etc.) of the layer 722 are monitored and information indicative of the characteristic(s) is fed back to one or both of the DC supplies 740, 742 and used to modulate power to one or more of the electrodes 730 so that material is deposited on the substrate 720 in accordance with the target deposition profile 768.

In the exemplary embodiment depicted in FIG. 7, both DC power supplies 740, 742 are configured to apply alternating DC voltages defined to cause the material from the electrodes 740 and 742 to be deposited in a deposition layer 722 with the specified target deposition profile 768. Although the target deposition profile 768 depicted in FIG. 7 is a uniform thickness deposition profile, in some embodiments, the target deposition profile 768 is a non-uniform thickness and/or non-uniform composition profile. In other words, in some variations, the thickness and/or composition at different points in a target deposition profile are different.

As shown in FIG. 7, the dashed lines 764 illustrate a typical tapered deposition profile (also referred to as thickness roll-off) that departs from the uniform thickness deposition profile 768 near the edges of the substrate 720 absent the techniques described herein. The edge of a substrate is susceptible to thickness roll-off because the electrode near the edge of a substrate, such as electrode 752 shown in FIG. 7, does not have a neighboring electrode that can contribute to deposition at the edge.

In many variations, the alternating DC pulses that are applied to each of the electrodes 730 are produced according to pulse parameter values (e.g., parameter values defining duty cycle, pulse width, pulse magnitude, etc.) that are defined to effectuate sputtering that produces the deposition profile 768. In many implementations for example, the DC pulses (e.g., negative DC pulses and/or positive DC pulses) that are applied to the electrodes 752 and 754 are coordinated to achieve substantially uniform deposition (e.g., without the tapered deposition profile) at the edge of the substrate 720.

Figure 8A:
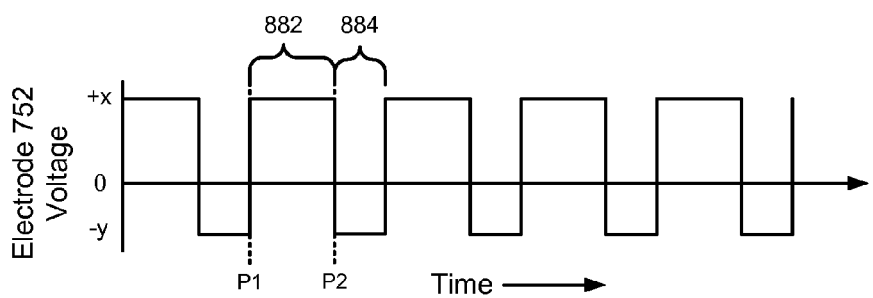
FIG. 8A is a graph that illustrates DC power pulses delivered to an electrode shown in FIG. 7, according to an embodiment of the invention.
Figure 8B:
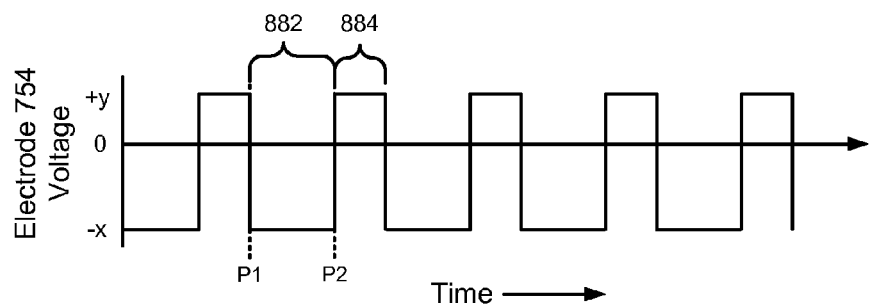
FIG. 8B is a graph that illustrates DC power pulses delivered to an electrode shown in FIG. 7, according to an embodiment of the invention.

For example, the time that electrode 752 is functioning as a cathode may be greater than the time that electrode 754 functions as a cathode. Also, the power level of DC power pulses delivered to electrode 752 while functioning as a cathode may be greater than the power level of DC power pulses delivered to electrode 754 while electrode 754 functions as a cathode. FIGS. 8A and 8B are schematic graphs that illustrate DC pulses delivered to electrodes 752 and 754, respectively, from DC power supply 740 shown in FIG. 7, according to an exemplary embodiment of the invention.

As shown, FIGS. 8A and 8B illustrate DC voltage on their respective vertical axes and time increasing to the right on their respective horizontal axes. The graphs illustrate that when a DC pulse of a specified polarity is delivered to one electrode for a specified period of time, a DC pulse of an opposite polarity is delivered to the other electrode during the same period of time, since a measurement is made with a positive terminal of a probe on the electrode noted on the vertical axis, and the negative terminal on the other electrode of the pair.

For example, starting at time P1 a positive DC pulse at a voltage of +x is delivered to electrode 752 from DC power supply 740 for period of time 882 and a negative DC pulse at a voltage of −x is delivered to electrode 754 for period of time 882. Similarly, starting at time P2 a negative DC pulse at a voltage of −y is delivered to electrode 752 from DC power supply 740 for period of time 884 and a negative DC pulse at a voltage of +y is delivered to electrode 754 for period of time 884.

In this embodiment, the total power delivered by the DC power supply 740 is smaller during time period 884 than during time period 882. By delivering positive DC pulses at higher power levels and for longer periods of time when electrode 752 is functioning as a cathode, the deposition rate near the edge of the substrate 720 (e.g., deposition rate corresponding with electrode 752) will be higher than the deposition rate corresponding with electrode 754.

Referring back to FIG. 7, DC power supply 742, similar to DC power supply 740, in some embodiments configured to deliver DC pulses of longer duration and higher power to electrode 760 than to electrodes 756 and 758 when electrode 760 is functioning as a cathode. In some embodiments, the duration of the DC power pulses delivered to electrode 760 is longer than the duration of the combined DC power pulses of electrodes 756 and 758.

The relative distance, in some variations, of an electrode to the substrate 720 and/or deposition layer 722 is different than another electrode. For example, electrode 752 and electrode 754 can be different distances from the substrate 720 to facilitate deposition of a particular deposition profile such as a uniform target deposition profile. And in some embodiments, the pulses (e.g., duty cycles) applied to an electrode is defined based on the distances of the electrode from the substrate 720 and/or deposition layer 722.

In some embodiments, a size (e.g., width, height), a shape (e.g., annular, rectangular), and/or a composition (e.g., specific chemical composition of metal, metallic compound, or ceramic) of one or more of the electrodes 730 is defined to facilitate deposition of a particular deposition profile. In some embodiments, one or more of the electrodes 730 can be a different size, shape, and/or composition than another of the electrodes 730. In some embodiments, one or more of the pulses (e.g., duty cycles) applied to an electrode are defined based on the size, shape, and/or composition of the electrodes.

In some embodiments, two of the electrodes 730 include different materials (e.g., different target materials), and DC pulses may be defined and applied (e.g., defined using pulse parameter values) to the electrodes 730 constructed of different materials to achieve a deposition layer 722 of a particular chemical composition (e.g., specified stoichiometry). One example is combining Indium and Tin target materials with Oxygen and Argon gas to metallic sputter Indium Tin Oxide. This type of sputtering, in some variations, is referred to as co-sputtering, and this technique is attractive because it can be used to deposit films with controlled mixtures of materials. This can be done to control stoichiometry or because a compound target material is difficult to sputter or expensive and/or difficult to create. As another example, $Al_2O_3$ can be deposited with a refractive index of about 1.66 and $TiO_2$ can be deposited with a refractive index of about 2.4. A reactive co-sputtering process with an A1 target and a T1 target and oxygen as the reactive gas is capable in principle of depositing films with a refractive index between 1.66 and 2.4.

In many embodiments electrodes 730 in the embodiment depicted in FIG. 7 are powered by two different DC power supplies 740, 742 that apply DC pulses at ultra-low frequencies, and as a consequence, the DC power supplies 740, 742, in some implementations, are load matched. In other words, the DC pulses generated by the DC power supplies 740, 742 can be coordinated to, for example, reduce plasma arcing, increase deposition control according to a target deposition profile, and reduce thermal inconsistency within the plasma sputtering chamber 710.

By way of further example, in some variations, DC power supplies 740, 742 are configured to deliver DC pulses such that electrodes 754 and 756 are not functioning as cathodes at the same time to avoid simultaneously depositing material from both of the electrodes 754 and 756 at location 774. In some variations, DC power supplies 740 and 742 are configured to deliver DC power pulses such that electrodes 754 and 756 are functioning as cathodes or as anodes at the same time.

Although in this embodiment the electrodes 730 receive pulses from two different DC power supplies 740, 742, in some embodiments, the electrodes received power pulses from a single DC power supply that includes, for example, a multi-phase bridge in a power control component that controls and/or defines the distribution of power in DC pulses. This type of arrangement can be referred to as a multiple magnetron arrangement, and in some implementations, the electrodes 730 receive DC power pulses from more than two DC power supplies (e.g., one DC power supply for each electrode). And in other embodiments DC pulses are defined/coordinated between non-adjacent electrodes.

Figure 9:
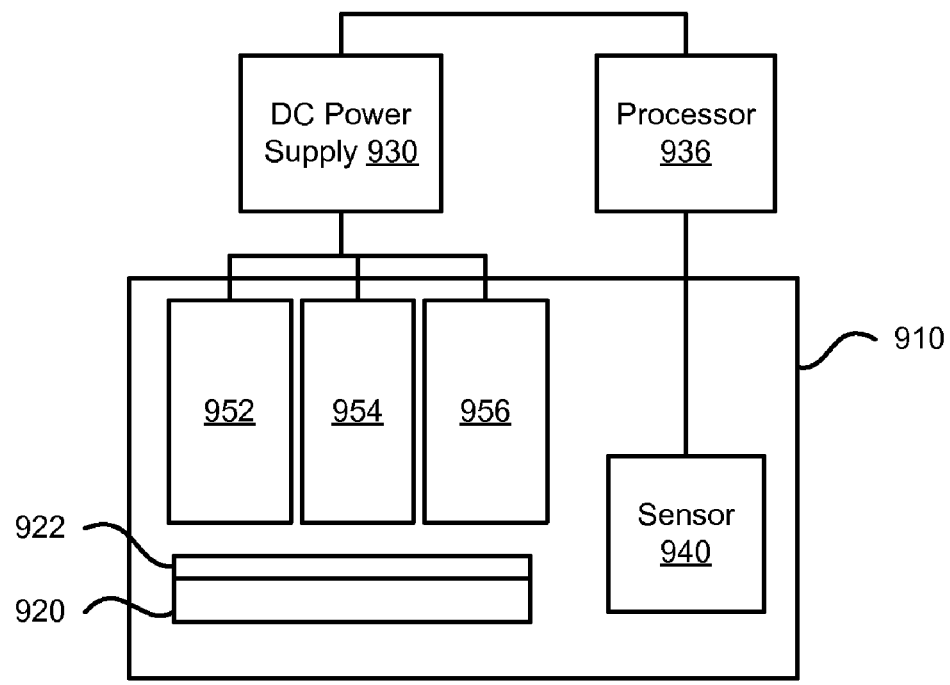
FIG. 9 is a block diagram that illustrates a plasma sputtering chamber configured to receive DC power pulses delivered by DC power supply, according to an embodiment of the invention.

FIG. 9 is a schematic block diagram that illustrates a plasma sputtering chamber 910 configured to receive DC pulses applied by DC power supply 930, according to an embodiment of the invention. The DC power supply 930 is configured to modify DC power pulses delivered to the plasma sputtering chamber 910 based on at least one process feedback signal (e.g., signal associated with a sensor measurement value such as a voltage signal or current signal) produced by a sensor 940.

A processor 936 is configured to receive the feedback signal from the sensor 940 and trigger modification of one or more DC pulses applied by DC power supply 930 to the plasma sputtering chamber 910 based on the feedback signal. The plasma sputtering chamber 910 is used to sputter a deposition layer 922 on a substrate 920 disposed within the plasma sputtering chamber 910. In some embodiments, the deposition layer 922 is associated with a thin-film transistor process. Although the sensor 940 is depicted within the chamber 910, this is certainly not required, and one of ordinary skill will appreciate that the sensor 940 in some instances may be located outside of the chamber.

In some embodiments, the processor 936 is configured to query the sensor 940 for a feedback signal. In some embodiments, the sensor 940 is configured to send a feedback signal to the processor 936 when a change in, for example, a sensor measurement value (e.g., voltage signal) associated with the sensor 940 is detected. In some embodiments, the processor 936 is configured to periodically or randomly receive a feedback signal from the sensor 940 and trigger one or more changes in DC power pulses delivered by the DC power supply 930 when a change (e.g., change that exceeds a threshold condition) in a monitored parameter occurs.

In some embodiments, the sensor 940 is a thickness monitoring device (e.g., electrical and/or optical measuring device) configured to monitor the thickness of the deposition layer 922 and send information indicative of the thickness to the processor 936. In some embodiments, the sensor 940 is configured to monitor a portion (e.g., specified area, specific location) of the thickness of the deposition layer 922, and based on the information from the sensor, the processor 936 is configured to modulate the power that the DC power supply 930 applies to one or more of the electrodes 952, 954, 956. In some implementations, the processor 936 is configured to modify one or more pulse parameter values used to define one or more of the DC pulses. In some implementations, the sensor 940 is a pressure sensor, a deposition rate sensor, conductivity sensor or a temperature sensor.

In some embodiments, multiple sensors (not shown) are configured to send feedback signals to the processor 936, and the processor 936 is configured to change the DC pulses based on the combination of the feedback signals. In some implementations, one or more of the feedback signals are associated with different spatial locations of the deposition layer 922 and the processor 936 is configured to modify DC pulses corresponding with each of the spatial locations if necessary.

In some implementations, the processor 936 is configured to change (e.g., modify) or trigger a change in a pulse parameter value (e.g., stored in a memory (not shown)) associated with a DC pulse to cause a change in a DC pulse based on one or more feedback signals (e.g., deposition rate feedback signal, temperature feedback signal, pressure feedback signal). For example, the processor 936 may be configured to select one or more sets of pulse parameter values stored in a memory from a library of pulse parameter values based on one or more feedback signals from one or more sensors. In some alternative embodiments, the processor 936 is configured to calculate characteristics of a DC pulse that should be applied to one or more electrodes (e.g., based upon feedback from the sensor 940) using equations (e.g., an algorithm) stored in a memory. The DC power pulses, in some implementations, are modified by changing and/or managing (e.g., controlling) the current, duty cycle, and/or voltage to one or more of the electrodes 952, 954, 956.

As an example, in some embodiments data related to the DC pulses is collected and used to calculate an average sputter power for one or more of the electrodes 952, 954, 956, and the DC pulses are modified to maintain a specified average sputter power over a specified period of time. The specified average sputter power is, in many embodiments, associated with one or more electrodes, and in some embodiments, an average sputter power threshold or average sputter power condition is defined based on a desired target deposition profile.

Although the processor 936 is shown as a stand-alone component in FIG. 9, in some implementations, the processor 936 (or the functionality of the processor 936) is included as part of the DC power supply 930 or the sensor 940. The processor 936 in some embodiments includes one or more modules that can be hardware and/or or software modules that are executed on the processor 936.

Figure 10:
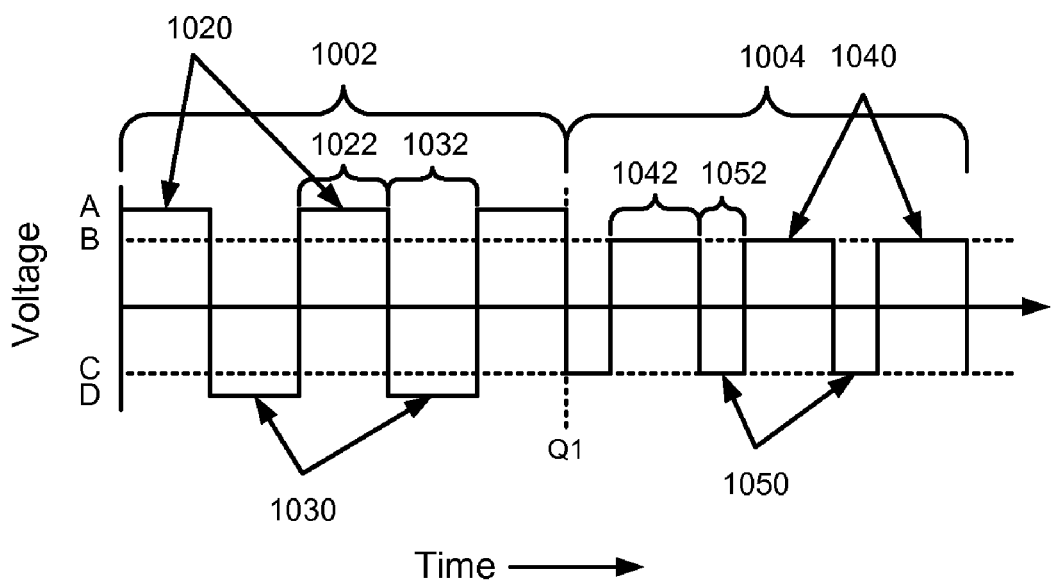
FIG. 10 is a schematic diagram of a graph that illustrates a change in DC power pulses triggered by one or more feedback signal from one or more sensors, according to an embodiment of the invention.

FIG. 10 is a graph that depicts an exemplary change in DC pulses triggered by one or more feedback signals from one or more sensors, according to an embodiment of the invention. It should be recognized that the pulse modulation depicted in FIG. 10 is merely exemplary of the type of pulse modulation (e.g., pulse width and magnitude) that may be carried out to effectuate a desired deposition profile, and that the specific modulation is potentially dependent upon many factors (e.g., the target material, electrode spacing, deposition profile, etc.). In addition, in some embodiments, pulse modulation is carried out to effectuate a particular target utilization (e.g., to optimize target material utilization). As shown, the graph illustrates DC voltage on the y-axis and time increasing to the right on the x-axis.

As shown in FIG. 10, the DC pulses are modified at time Q1 in response to a feedback signal between a first time period 1002 and a second time period 1004. During the first time period 1002, the positive DC pulses 1020 have a pulse height of A and a pulse width of 1022, and the negative DC pulses 1030 have a pulse height of D and a pulse width of 1032. During time period 1004, the positive DC pulses 1040 have a pulse height of B and a pulse width of 1042 and the negative DC pulses 1050 have a pulse height of C and a pulse width of 1052.

As depicted, during the second time period 1004, the pulse width 1042 of the positive DC pulses 1040 is greater than the pulse width 1022 of positive pulses 1020 during the first time period 1002 and the pulse height B of the pulses during the second time period 1004 is less than the pulse height A of the of positive pulses 1020 during the first time period 1002.

Figure 11:
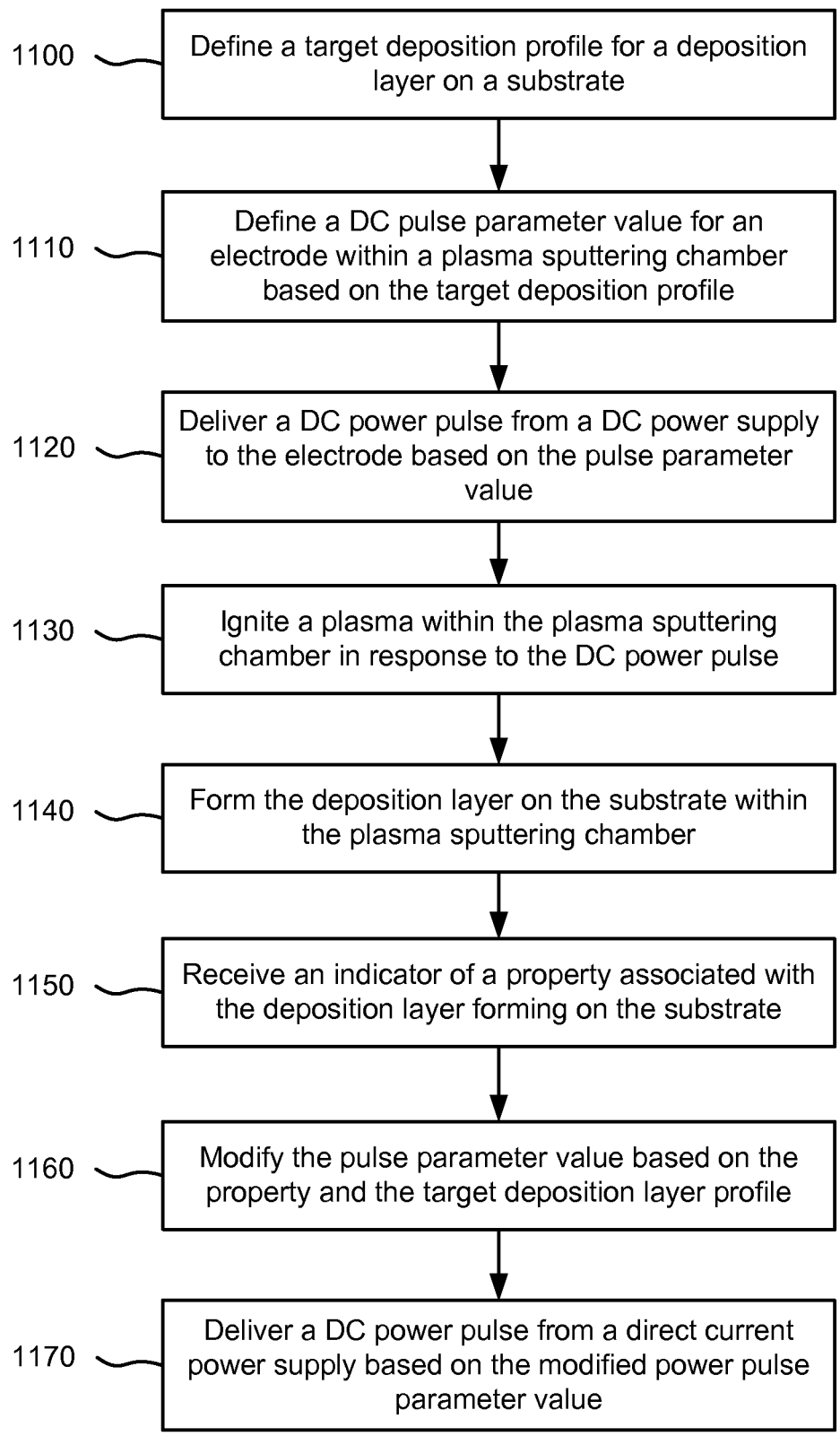
FIG. 11 is a flowchart that illustrates a method for modifying a DC power pulse in response to a property associated with a deposition layer, according to an embodiment of the invention.

Referring next to FIG. 11, shown is a flowchart that illustrates a method for modifying a DC pulse in response to a property (also can be referred to as a characteristic) associated with a deposition layer, according to an embodiment of the invention. As shown, a target deposition profile for a deposition layer on a substrate is initially defined in terms of one or more characteristics (e.g., thickness, resistance, an optical property, film stress, density, and adhesion)(Block 1100). As discussed, the target deposition profile may be a uniform or non-uniform thickness profile with a specified chemical composition, and the target deposition profile may specify varying chemical compositions at different locations in the deposition layer.

As depicted, in some embodiments a pulse parameter value is defined for at least one electrode within a plasma sputtering chamber based on the target deposition profile (Block 1110). The pulse parameter value is defined to cause deposition according to the target deposition profile. As discussed, in some embodiments, pulse parameter values may be calculated during deposition and in other embodiments pulse parameter values may be predefined and accessed from a table.

Once a pulse parameter value is defined, a DC pulse is applied to the electrode based on the pulse parameter value, and a plasma is ignited within the plasma sputtering chamber in response to the DC pulse (Blocks 1120 and 1130).

As shown, once the plasma is ignited, the deposition layer is formed on the substrate within the plasma sputtering chamber (Block 1140). As previously discussed above, in many embodiments, while the deposition layer is formed, the substrate is statically maintained in substantially one position, and in other embodiments, the substrate is moved during deposition.

As depicted in FIG. 11, in many embodiments information indicative of a property (e.g., thickness, resistance, chemical composition, optical characteristic, film stress, density, adhesion, temperature and/or pressure within the chamber) associated with the deposition layer is received during while the deposition layer is being formed (Block 1150).

In response to the feedback from the chamber, in many implementations, the pulse parameter value is modified based on the received information and the desired target deposition profile (Block 1160). For example, if the property is a chemical composition and the information indicates that the chemical composition of the deposition layer is different than that specified target property associated with the target deposition profile, the pulse parameter value may be modified to cause sputtering that will satisfy the target property associated with the target deposition profile. As shown, after the pulse parameter value has been modified (Block 1160), a DC pulse is applied to the electrode based on the modified pulse parameter value (Block 11170).

Some embodiments relate to a computer storage product with a computer-readable medium (also referred to as a processor-readable medium) having instructions or computer code thereon for performing various computer-implemented operations. The media and computer code (also referred to as code) may be those specially designed and constructed for the specific purpose or purposes.

One of ordinary skill in the art will appreciate that embodiments described herein may be realized by a combination of hardware, firmware, software and a combination thereof. In some embodiments, processor-readable media is utilized to store encoded instructions to effectuate processes described herein. Examples of processor-readable media include, but are not limited to: magnetic storage media such as hard disks, floppy disks, and magnetic tape; optical storage media such as Compact Disc/Digital Video Discs ("CD/DVDs"), Compact Disc-Read Only Memories ("CD-ROMs"), and holographic devices; magneto-optical storage media such as floptical disks; carrier wave signals; and hardware devices that are specially configured to store and execute program code, such as Application-Specific Integrated Circuits ("ASICs"), Programmable Logic Devices ("PLDs"), and ROM and RAM devices.

Examples of computer code include, but are not limited to, micro-code or micro-instructions, machine instructions, such as produced by a compiler, and files containing higher-level instructions that are executed by a computer using an interpreter. For example, an embodiment of the invention may be implemented using Java, C++, or other object-oriented programming language and development tools. Additional examples of computer code include, but are not limited to, control signals, encrypted code, and compressed code.

In conclusion, the disclosure describes, among other things, methods and apparatus for plasma-based sputtering deposition using a DC power. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A system for depositing material on a substrate in a plasma processing chamber, comprising:
    a direct current power source configured to deliver a first direct current power pulse having a first polarity and a second direct current power pulse having a second polarity to an electrode within a plasma sputtering chamber, wherein the electrode operates as an anode, a cathode, and a sputtering target;
    a feedback line from the chamber; and
    a processor configured to trigger the second direct current power pulse after the first direct current power pulse has been triggered and to modulate, responsive to a feedback signal on the feedback line, an amount of power applied to the electrode with the first direct current power pulse.

2. The system of claim 1, wherein the processor is configured to trigger the second direct current power pulse such that a time period between the first direct current power pulse and the second direct current power pulse is less than an arc detection time associated with the direct current power source.

3. The system of claim 1, wherein the amount of power applied to the electrode with the first power pulse is modulated by modulating an amount of time the first power pulse is applied to the electrode relative to the second power pulse.

4. The system of claim 1, wherein the amount of power applied to the electrode with the first power pulse is modulated by modulating a magnitude of the first power pulse relative to a magnitude of the second power pulse.

5. The system of claim 1, wherein the processor is configured to modify, based on the feedback signal, a pulse parameter value used to define at least one of the first direct current power pulse or the second direct current power pulse.

6. A method for depositing material on a substrate comprising:
    delivering direct current power pulses to at least two adjacent electrodes within a plasma sputtering chamber from at least one direct current power source, the at least two adjacent electrodes depositing material on to the substrate, wherein the at least two adjacent electrodes are each configured to operate as an anode, a cathode, and a sputtering target;
    receiving feedback indicative of a first amount of material remaining on either of the at least two adjacent electrodes; and
    controlling an amount of power delivered to the at least two adjacent electrodes responsive to the feedback so as to alter the deposition of the material.

7. The method of claim 6, wherein controlling includes modifying a duty cycle of the power delivered to the at least two adjacent electrodes.

8. The method of claim 6, wherein controlling includes modulating a magnitude of the power delivered to the at least two adjacent electrodes.

9. The method of claim 6, wherein delivering includes delivering
    direct current power pulses to each of at least three electrodes within a plasma sputtering chamber from at least one direct current power source, each of the electrodes depositing material on to the substrate;
    placing the substrate in a stationary position within the chamber; and
    modulating power to at least two of the at least three electrodes so as to uniformly deposit the material on to the substrate.

10. A system for depositing material on a substrate in a plasma processing chamber, comprising:
    a direct current power control component configured to deliver a first direct current power pulse having a first polarity and a second direct current power pulse having a second polarity to an electrode within a plasma sputtering chamber, wherein the electrode operates as an anode, a cathode, and a sputtering target;
    a feedback line configured to provide a signal indicative of a target material utilization on the electrode; and
    a processor configured to trigger the second direct current power pulse after the first direct current power pulse has been triggered and to modulate, responsive to the signal indicative of the target material utilization, an amount of power applied to the electrode with the first direct current power pulse.

11. The system of claim 10, wherein the processor is configured to modulate, responsive to the signal indicative of the target material utilization, an amount of power applied to the electrode with the first direct current power pulse so as to optimize an amount of target material utilized.

12. The system of claim 10, wherein the signal indicative of the target material utilization is a signal indicative of the target material thickness.

* * * * *